United States Patent [19]

Testa et al.

[11] 4,001,812
[45] Jan. 4, 1977

[54] METHOD OF AND MEANS FOR QUANTIZING ANALOG-VOLTAGE SAMPLES

[75] Inventors: Giorgio Testa, Milan; Mario Pozzi, Mozzate, both of Italy

[73] Assignee: Societa Italiana Telecomunicazioni Siemens S.p.A., Milan, Italy

[22] Filed: May 15, 1975

[21] Appl. No.: 577,673

[30] Foreign Application Priority Data

May 15, 1974 Italy .................................. 22728/74

[52] U.S. Cl. .................. 340/347 NT; 340/347 AD; 179/15 AP
[51] Int. Cl.² ........................................ H03K 13/20
[58] Field of Search ............. 340/347 AD, 347 NT, 340/347 DA, 347 CC; 179/15 AP

[56] References Cited

UNITED STATES PATENTS

| | | | |
|---|---|---|---|
| 3,495,238 | 2/1970 | Gabriel ....................... | 340/347 CC |
| 3,564,538 | 2/1971 | Bondzeit et al. ............ | 340/347 NT |
| 3,646,545 | 2/1972 | Naydan ....................... | 340/347 NT |
| 3,737,892 | 6/1973 | Dorey .......................... | 340/347 NT |
| 3,768,009 | 10/1973 | Dorey .......................... | 340/347 NT |
| 3,778,812 | 12/1972 | Bayati ......................... | 340/347 NT |
| 3,842,416 | 10/1974 | Eto .............................. | 340/347 NT |

*Primary Examiner*—Charles D. Miller
*Attorney, Agent, or Firm*—Karl F. Ross; Herbert Dubno

[57] ABSTRACT

Analog-voltage samples to be transmitted in digital form over a communication channel, ranging between a lower and an upper limit $V_{min}$ and $V_{max}$, are quantized in $2^n$ levels with $2^{n/2}$ major quantum steps each subdivided into $2^{n/2}$ minor quantum steps represented by $n$-bit words, a group of $n/2$ bits of each word representing the major quantum steps and another group of $n/2$ bits representing the minor quantum steps. A converter at the transmitting end includes a first and a second constant-current generator, of high and low rate respectively, which are sequentially activated to discharge and to charge an input capacitor temporarily storing an analog-voltage sample to be digitized. The first generator rapidly discharges the input capacitor while an associated first pulse counter receives a series of forward-counting clock pulses, each pulse corresponding to a major quantum step, until the absolute value of the capacitor voltage drops below that of a predetermined reference voltage $V_r = V_{min}$, the cutoff of the count being determined by the trailing edge of a clock pulse. The second generator then slowly recharges the capacitor to substantially the reference voltage while an associated second pulse counter receives forward-counting clock pulses to count the minor quantum steps. The stage outputs of the first and second pulse counters deliver the bits of the word to be transmitted over the channel to a reconverter at the receiving end including third and fourth constant-current generators, respectively similar to the first and second generators, which are sequentially activated under the control of a third and a fourth pulse counter respectively preloaded with the two groups of $n/2$ bits of the incoming code word. The third counter receives backward-counting clock pulses until it reaches an all-zero position, the associated third generator rapidly charging an output capacitor during this period; then the fourth counter receives backward-counting clock pulses until it reaches the all-zero position while the associated fourth generator slowly discharges the output capacitor. With the third and fourth counters both reset to zero, the output capacitor has a charge equal (or proportional) to that of the input capacitor which was translated into the received code word. The output of the highest-ranking stage of the first counter may be integrated to provide a corrective potential compensating for relative drifts between the mean signal voltage and the reference voltage.

7 Claims, 6 Drawing Figures

4,001,812

METHOD OF AND MEANS FOR QUANTIZING ANALOG-VOLTAGE SAMPLES

FIELD OF THE INVENTION

Our present invention relates to a method of and means for translating analog-voltage samples into binary words, and vice versa, particularly for the transmission of messages in a telephone or other telecommunication system of the time-division-multiplex (TDM) type.

BACKGROUND OF THE INVENTION

In conventional TDM telecommunication systems, designed for the concurrent transmission of a multiplicity of messages over respective channels between two stations or terminals, each channel is provided with an analog/digital converter or coder at its transmission end and a complementary reconverter or decoder at its receiving end, the converter including a generator of a ramp voltage of constant negative slope whose starting amplitude is proportional to the message sample to be transmitted; a counter of clock pulses measures the time required by the ramp voltage to drop to a predetermined reference level whereby the pulse count is proportional to the amplitude of the sample. With a message signal ranging between a lower voltage limit $V_{min}$ and an upper voltage limit $V_{max}$, the range $V_{max} - V_{min}$ is divided into $2^n$ quantum steps so that the digitized sample can be represented by a word of $n$ bits.

If the highest signal frequency has a magnitude of 4KHz, as is usual in a telephone system, a cadence of one sample per half-cycle of this frequency corresponds to a sampling period $T_z = 125\mu s$. With an accommodation period $T_a = 5\mu s$ provided for the storage of each new sample, the available digitization interval $T_x = T_z - T_a$ is $120\mu s$. For $n = 12$ we have a bit rate of $$\frac{2^n}{T_x} = \frac{4096}{120 \cdot 10^{-6}} \approx 34 \cdot 10^6 \text{ bit/sec.}$$

A pulse-code-modulation (PCM) system operating at such high speeds requires the use of relatively expensive semiconductors whose energy consumption is high.

OBJECTS OF THE INVENTION

The general object of our present invention, therefore, is to provide an improved method of and means for linearly quantizing analog-voltage samples at a substantially reduced bit rate for a given number of quantum steps.

A related object is to provide simplified analog-digital conversion means for a TDM/PCM telecommunications sytem.

SUMMARY OF THE INVENTION

In accordance with our invention, the $2^n$ quantum steps of an analog-voltage range ($n$ being an even integer) include $2^{n/2}$ major steps each subdivided into $2^{n/2}$ minor steps of uniform height, each digitized voltage sample consisting of a first group of $n/2$ bits representing a number of major quantum steps and a second group of $n/2$ bits representing a number of minor quantum steps together defining the signal amplitude. More particularly, the first group identifies the highest major quantum step reached by the signal amplitude whereas the second group gives the number of minor quantum steps, if any, by which that signal amplitude falls short of the upper level of this major quantum step. Thus, the resulting binary word consists of $$2^{\frac{n}{2}+1}$$

bits, generated within a digitization interval $T_x$, the bits coinciding with respective clock pulses whose period T is therefore given as $$T = \frac{T_x}{2^{n/2}+1}$$

In order to ascertain the number of major quantum steps, we provide a first constant-current generator connected across an input capacitor, which is charged with the analog-voltage sample to be digitized, for linearly discharging same at a relatively high rate sufficient to reduce its voltage from the upper range limit $V_{max}$ to the lower range limit $V_{min}$ in not more than half the aforementioned digitization interval $T_x$; the number of minor quantum steps is ascertained by a second constant-current generator connected across the same capacitor for linearly charging same at a relatively low rate. A source of forward-counting clock pulses, of period $$T = \frac{T_x}{2^{\frac{n}{2}+1}}$$

serves to step a first pulse counter during operation of the first generator and a second counter during operation of the second generator, the current rates of these two generators being so proportioned that the clock pulses coincide with respective major quantum steps of the decreasing capacitor voltage during operation of the first current generator and with respective minor quantum steps of the increasing capacitor voltage during operation of the second current generator. A discriminating circuit, connected to the input capacitor and to a supply of reference voltage corresponding to the lower range limit $V_{min}$, controls the sequential actuation of the two constant-current generators and the stepping of the associated pulse counters with the aid of first and second switch means, the first switch means being responsive to the clock pulses for terminating the discharge of the input capacitor by the first generator only after a whole number of pulse periods T as soon as the capacitor voltage drops from an original absolute value greater than $V_{min}$ to an absolute value less than that of $V_{min}$. Upon this relative reversal of the two voltages fed to the discriminator, the second counter registers the number of clock pulses occurring during recharging until the capacitor voltage substantially equals the reference level $V_{min}$, i.e. until its absolute value has risen sufficiently above that level to restore the initial operating condition of the discriminator. Thus, the several stage outputs of the two pulse counters produce the two aforementioned bit groups indicating the number of major and minor quantum steps which must be subtractively combined to give the quantized signal amplitude.

If the binary word synthesized from these two bit groups is transmitted over a channel of a telecommunication system, the original analog sample can be replicated at the receiving end of the channel with the aid of a third and a fourth constant-current generator having the same current ratio as the first and second generators at the transmitting end, the receiving-end current generators respectively coacting with a third and a fourth pulse counter which are reverse-stepped by backward-counting clock pulses (preferably having the same cadence as the forward-counting clock pulses at the transmitting end) after having been preloaded with the first and the second group of $n/2$ bits, respectively. Under the control of third and fourth switch means, the third generator linearly charges an output capacitor during the reverse-stepping of the third pulse counter until the latter is reset to zero whereupon the fourth generator linearly discharges that capacitor while the fourth pulse counter is reverse-stepped until it, too, reaches a zero count. The output capacitor is included in a load circuit and can be periodically discharged to a suitable starting level analogous to the reference level $V_{min}$ at the transmitting end.

Since, in practice, the switchover between first and second constant-current generators and associated counters at the transmitting end may not be as instantaneous as would be required for a precise count of the number of major quantum steps, it may happen with signal voltages only slightly less than a whole number of major quantum steps that the first counter takes an additional step and the termination of the discharge of the input capacitor is correspondingly delayed. As this would increase the count of minor quantum steps by the second counter beyond $n2$, another feature of our invention involves the enlargement of the capacity of this second counter to more than $2^{2/n}$ and the reduction of the count of the first counter by 1 upon the second counter reaching the count of $2^{n/2}$. For this purpose, advantageously, the second counter comprises $(n/2) + 1$ stages connected to an associated decoder, only the first $n/2$ stages being used to produce the corresponding bit group.

If the analog signal is derived from an alternating-current voltage, as will normally be the case, that voltage can be changed into a unipolar sample by additively combining it with a potential of the proper polarity equal to the median level of the voltage range $V_{max} - V_{min}$. According to a further feature of our invention, this superposed median potential is derived via an inverting integrator from the last one of the $n2$ stage outputs of the first pulse counter which indicates the sign of the a-c voltage and which, in the presence of a balanced signal, is alternately energized and de-energized at regular intervals, thereby producing a square wave whose duty ratio varies with any deviation of the mean signal voltage from the median range level. This variation of the duty ratio results in a compensatory change of the integrator output to insure stable operation of the system, with automatic correction of relative drifts between the mean signal voltage and the reference voltage.

BRIEF DESCRIPTION OF THE DRAWING

The above and other features of our invention will now be described in detail with reference to the accompanying drawing in which.

SPECIFIC DESCRIPTION

Figure 1:
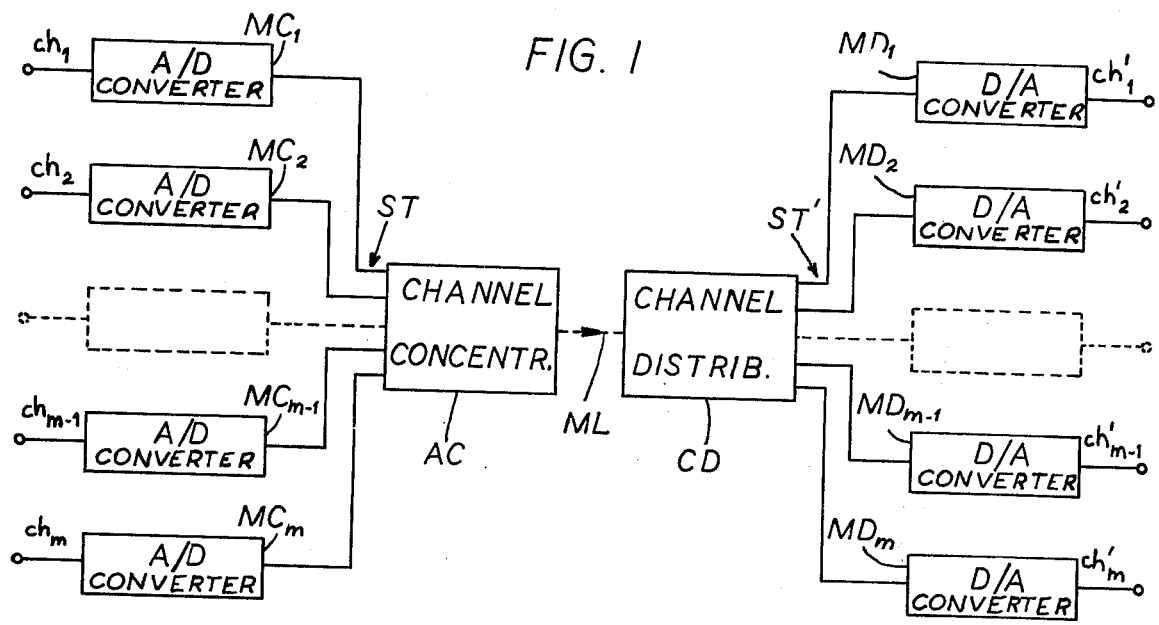
FIG. 1 is a block diagram of a TDM/PCM telecommunication system embodying our invention.

In FIG. 1 we have shown a telephone system with a pair of stations ST and ST' interconnected by a multichannel link ML, station ST serving as a transmitting terminal for a multiplicity of incoming channels $ch_1 - ch_m$ whereas station ST' is a receiving terminal for a like number of outgoing channels $ch'_1 - ch'_m$; each incoming channel is connected (at least temporarily) to its outgoing counterpart through a respective transmission channel forming part of the link ML. The several transmission channels may be represented, for example, by carriers of different frequencies transmitted over a common trunk line. In practice, of course, each station may be equipped for both transmission over and reception from the link ML.

Each incoming channel $ch_1 - ch_m$ transmits voice-frequency signals to a respective analog/digital converter $MC_1 - MC_m$ whose output is delivered to the link ML by a channel concentrator AC. At the remote end, a channel distributor CD works into a multiplicity of digital/analog converters $MD_1 - MD_m$ feeding the outgoing channels $ch'_1 - ch'_m$.

Figure 2:
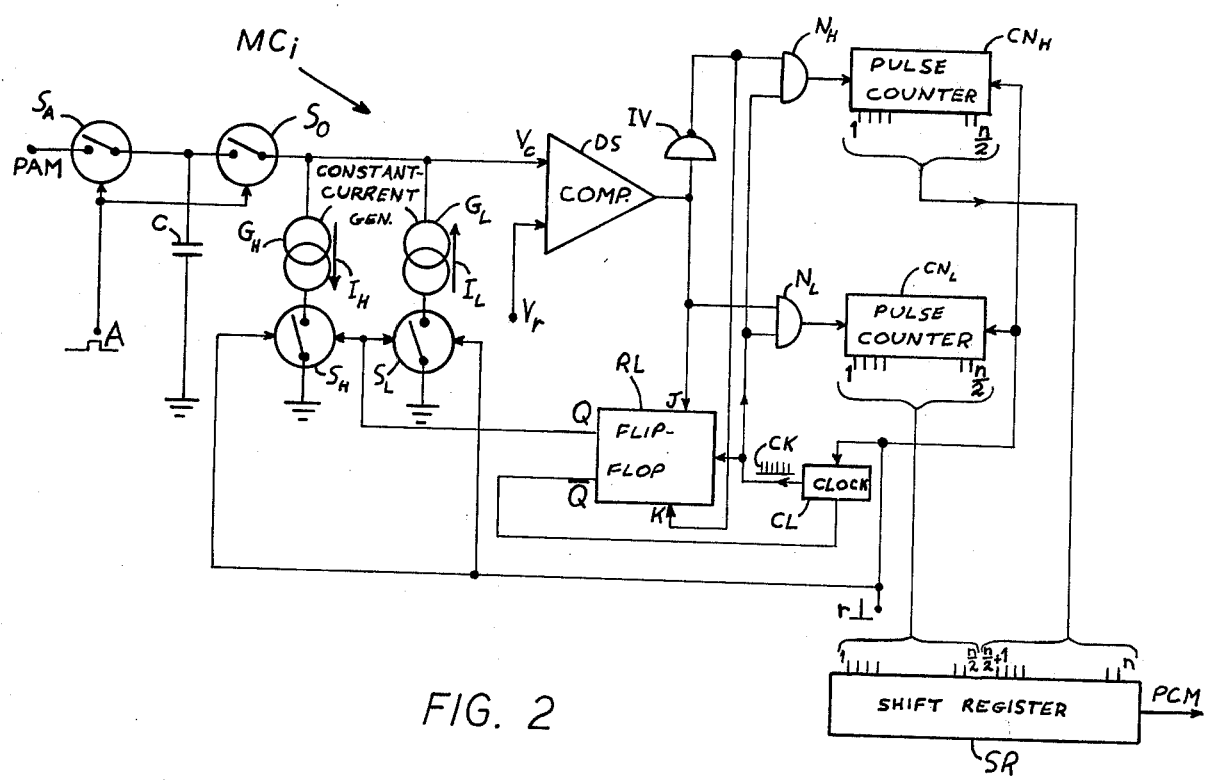
FIG. 2 is a circuit diagram of an analog/digital converter associated with a single channel of the telecommunication system of FIG. 1.

In FIG. 2 we have shown the basic structure of a representative analog/digital converter $MC_i$. This converter comprises an input capacitor C on which incoming voice samples, periodically obtained in the well-known manner, are stored under the control of a normally open switch $S_A$ which is briefly closed, during an accommodation interval $T_a$ (see FIG. 3), at the beginning of each sampling period by a pulse A lasting for, say, 5 μs. The length of a sampling period $T_z$ is assumed, as in the conventional system discussed above, to be 125 μs, leaving a digitization interval $T_x = 120$ μs.

Through another switch $S_O$, which is normally closed except in the presence of accommodation pulse A, capacitor C is connected in parallel with a pair of constant-current generators, i.e. a high-rate first generator $G_H$ in series with a switch $S_H$ and a low-rate second generator $G_L$ in series with a switch $S_L$. The currents $I_H$ and $I_L$ of these two generators bear a ratio of $2^{n/2}:1$, their polarities being such that current $I_H$ discharges and current $I_L$ charges the capacitor C. Switches $S_A$, $S_O$, $S_H$ and $S_L$, as well as other switches shown in subsequent Figures, are of course of the electronic type.

Figure 3:
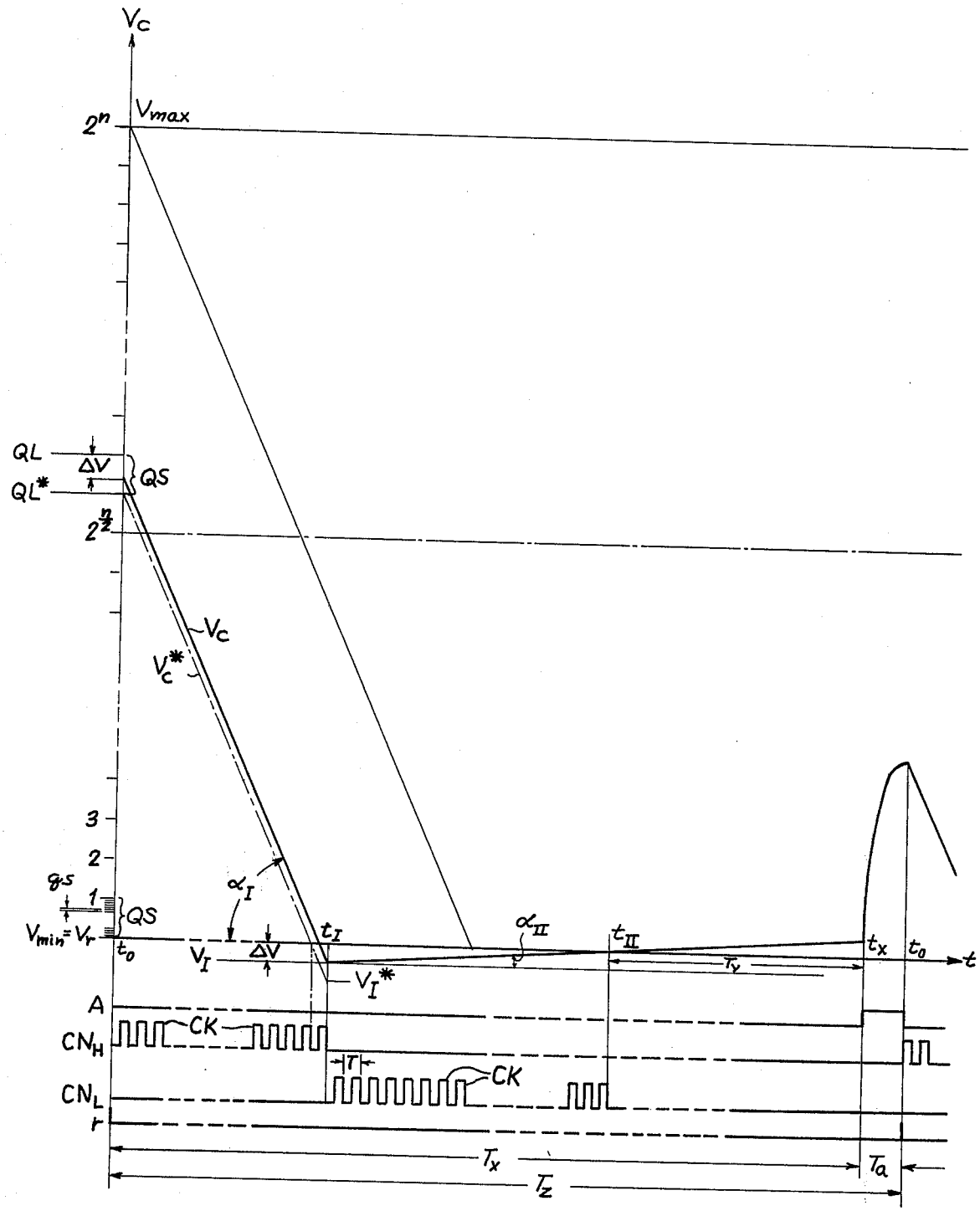
FIG. 3 is a graph serving to explain the operation of the converter of FIG. 2.

The ungrounded terminal of capacitor C, which in the presence of pulse A receives an analog sample PAM from the associated incoming channel, is connected via switch $S_O$ to an input of a comparator DS which thus is energized with the capacitor voltage $V_c$ upon closure of switch $S_O$. Another input of this comparator receives a constant reference voltage $V_r$, which, as indicated in FIG. 3, corresponds to the lower limit $V_{min}$ of a voltage range $V_{max} - V_{min}$ bracketing the possible magnitudes of analog sample PAM. Comparator DS has an output which is de-energized when the absolute magnitude of capacitor voltage $V_c$ exceeds that of reference voltage $V_r$, thereby unblocking an AND gate $N_H$ via an inverter IV, and is energized in the opposite case to unblock an AND gate $N_L$. The relative polarity of voltages $V_c$ and $V_r$ is also indicated to a logic circuit RL, here shown as a flip-flop with two data inputs J, K connected to the comparator output directly and via inverter IV, respectively. AND gates $N_H$ and $N_L$, working into the forward-stepping inputs of a first binary pulse counter $CN_H$ and a second binary pulse counter $CN_L$, respectively, receive clock pulses CK from a source CL which also energizes a switching input of flip-flop RL whose set and reset outputs are designated Q and $\bar{Q}$. Each counter $CN_H$, $CN_L$ has $n/2$ stage outputs connected to respective inputs of a shift register SR designed to read out a binary word PCM to the channel concentrator AC of FIG. 1.

As illustrated in FIG. 3, voltage range $V_{max} - V_{min}$ is divided into $2^n$ major quantum steps QS, the level $2^{n/2}$ being the midpoint of the range. The higher current rate of generator $G_H$ is represented by an angle $\alpha_I$, with $\tan \alpha_I = QS/T$ where T is the period of clock pulses CK alternatively fed to counters $CN_H$ and $CN_L$. Each major quantum step QS is subdivided into $2^{n/2}$ minor quantum steps qs, the low current rate of generator $G_L$ being represented by an angle $\alpha_{II}$, with $\tan \alpha_{II} = qs/T$. Thus, $\tan \alpha_I / \tan \alpha_{II} = QS/qs = 2^{n/2}$.

The number of clock cycles occurring within the digitization interval $T_x$ is equal to $2^{n+1}$. This insures that a voltage $V_c$ equal to $V_{max}$ on capacitor C (FIG. 2) will be reduced to the reference level $V_r = V_{min}$ in half the interval $T_x$ whereby the remaining half of that interval is available for a count of up to $2^{n/tc}$ minor quantum steps.

Pulse counters $CN_H$ and $CN_L$ are zeroized at the beginning of each sampling period $T_z$, i.e. at an instant $t_0$, by a resetting pulse r which also closes the switch $S_H$ and starts the clock CK; the flow of current $I_H$ now linearly discharges the capacitor C as shown in FIG. 3. Upon the first polarity reversal between voltages $V_c$ and $V_r$, i.e. at an instant $t_I$, the setting of flip-flop RL opens the switch $S_H$ and closes the switch $S_L$ which remains in that condition to the end of the period; the flow of current $I_L$ then recharges the capacitor C at a greatly reduced rate. Upon the second polarity reversal, i.e. at an instant $t_{II}$, the leading edge of the voltage pulse on output Q (which at that moment is not overriden by a pulse r) stops the clock CL so that no further stepping of either counter can take place during the remaining interval $T_Y$ while capacitor C is ineffectually charged beyond the threshold $V_r$ as likewise indicated in FIG. 3.

Let us assume that the capacitor voltage $V_c$ initially attains a level separated by a potential difference $\Delta V$ from the upper level QL of the highest major quantum step reached, $\Delta V$ being a fraction of such a quantum step QS. The discharge current $I_H$ drawn by generator $G_H$ from capacitor C, immediately after the occurrence of reset pulse r at instant $t_0$, linearly reduces the voltage $V_c$ to a level $V_I$ at the instant $t_I$ which coincides with the trailing edge of the first clock pulse CK following the first polarity reversal. This voltage $V_I$ falls short by $\Delta V$ of the reference voltage $V_r$ so that comparator DS now switches over, blocking the gate $N_H$ and unblocking the gate $N_L$ while reversing the flip-flop RL to open the switch $S_H$ and close the switch $S_L$. Thus, the clock pulses CK previously directed to counter $CN_H$ now load the counter $CN_L$, the reading of counter $CN_H$ remaining unchanged for the balance of the digitization interval $T_x$. The flow of charging current $I_L$ into capacitor C from generator $G_L$ raises the voltage $V_c$ to a point exceeding by not more than a minor quantum step qs the reference level $V_r$, with switchover of flip-flop RL on the trailing edge the clock pulse which follows this second polarity reversal and resulting cutoff of clock CL.

Figure 4:
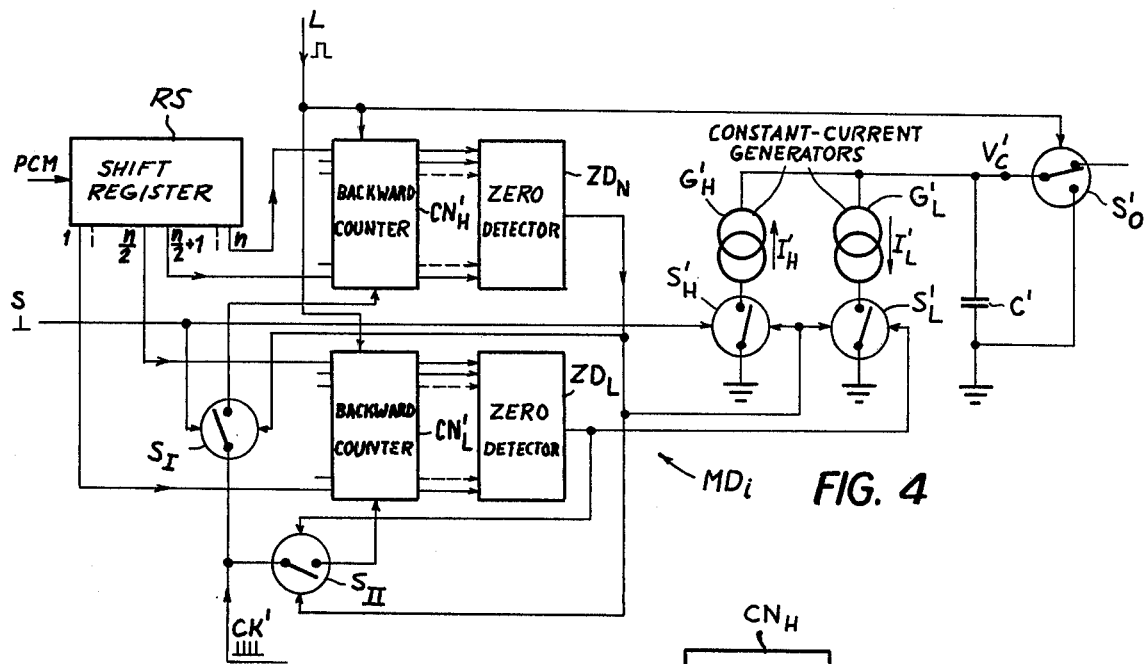
FIG. 4 is a circuit diagram of an analog/digital converter, complementary to the converter of FIG. 2, associated with a single channel of the system of FIG. 1.

Reference will now be made to FIG. 4 which shows a representative digital/analog converter or decoder $MD_i$ associated with one of the outgoing channels $ch'_1 - ch'_m$ of FIG. 1. A receiving circuit of this converter, including an $n$-stage shift register RS, obtains the incoming binary work PCM from the corresponding transmission channel; shift register RS, when loaded, holds the $n/2$ bits from counter $CN_H$ in its higher-ranking stages Nos. $(n/2) + 1) \ldots n$ and the $n/2$ bits from counter $CN_L$ in its lower-ranking stages Nos. $1 \ldots n/2$. The outputs of these two groups of stages respectively terminate at a pair of binary pulse counters $CN'_H$ and $CN'_L$ which are triggered by a loading pulse L at the beginning of a reconversion period so as to be preset with the counts of the major and minor quantum steps of the digitized sample PAM (FIG. 2). Backward-counting clock pulses CK' from a nonillustrated source can be fed to these counters via respective switches $S_I$ and $S_{II}$, switch $S_I$ being closed by a start pulse s immediately upon the disappearance of loading pulse L to step down the counter $CN'_H$ to an all-zero position. That position is detected by a decoder $ZD_H$ which thereupon opens the switch $S_I$ and closes the switch $S_{II}$ so that counter $CN'_L$ is now reverse-stepped to its all-zero position detected by a decoder $ZD_L$, the latter then reopening the switch $S_{II}$ to stop the countdown.

Two constant-current generators $G'_H$ and $G'_L$ are connected in parallel across an output capacitor $C'$ in series with respective switches $S'_H$ and $S'_L$. Generator $G'_H$ has an output current $I'_H$ of a polarity designed to charge the output capacitor $C'$ at a high rate preferably equal to the rate at which generator $G_H$ (FIG. 2) discharges the input capacitor C. Generator $G'_L$ has an output current $I'_L$ of the opposite polarity, designed to discharge the capacitor $C'$ at a rate related to the charging rate of generator $G'_H$ by a ratio of $1:2^{n/2}$. Switches $S'_H$ and $S'_L$ are opened and closed concurrently with switches $S_I$ and $S_{II}$, respectively, whereby the charging and discharging phases of capacitor $C'$ are precisely measured by the initial readings of counters $CN'_H$ and $CN'_L$; thus, the voltage $V'_c$ of output capacitor $C'$ eventually reaches a value which practically equals (or is proportional to) the original sample PAM. Capacitor $C'$ forms part of a load circuit that also includes an output switch $S'_0$, controlled by the pulse L, which transmits this final value of voltage $V'_c$ to a nonillustrated utilization circuit concurrently with the presetting of counters $CN'_H$ and $CN'_L$ at the beginning of the next cycle.

Figure 5:
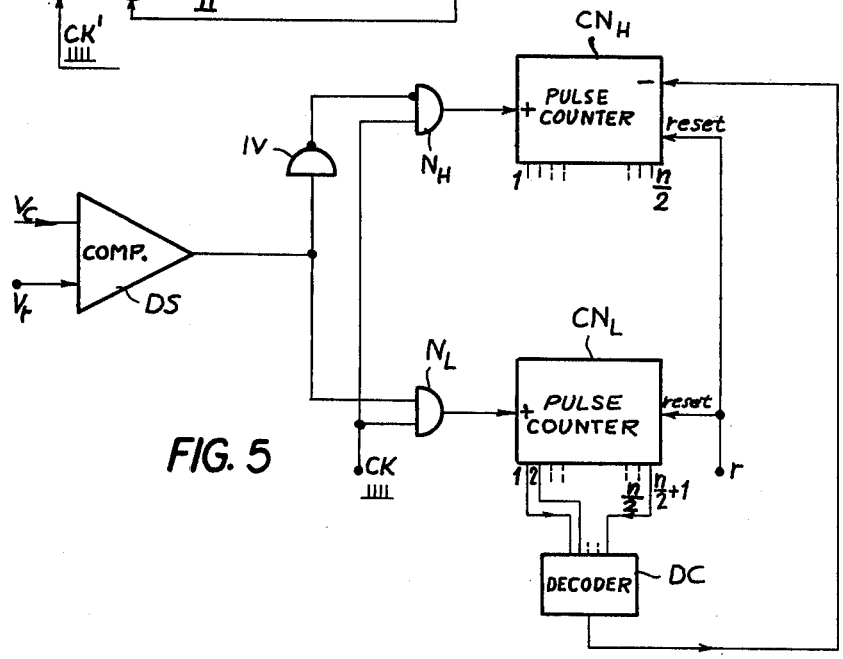
FIGS. 5 and 6 are two circuit diagrams similar to FIG. 2, showing additional features of the converter thereof.

In FIG. 3 we have also indicated a capacitor voltage $V_c^*$ corresponding to a sample whose magnitude equals a whole number of major quantum steps QS, the discharge of the capacitor C thus starting at a level QL*. The decreasing capacitor voltage $V_c^*$ intersects the reference level $V_r$ at an instant coinciding exactly with the trailing edge of a clock pulse CK which does not switch the flip-flop RL inasmuch as a polarity reversal in the input of comparator DS has not yet occurred. Thus, the capacitor discharges up to the time $t_I$, with counter $CN_H$ taking an additional step, reaching a voltage level $V_I^*$ which is exactly one major quantum step QS below level $V_r$. Upon the subsequent recharging, therefore, counter $CN_L$ registers $2^{n/2}$ minor quantum steps $qs$ which is exactly the number required to compensate for the extra forward step taken by counter $CN_H$. If, however, counter $CN_L$ has only the $n/2$ stages required for half the bits of the digitized analog sample PAM (i.e. six stages with $n = 12$), then this counter reverts to zero on the $(2^{n/2})^{th}$ clock pulse and cannot give a reading of $2^{n/2}$ (i.e. 32 in the specific case referred to). We therefore prefer to provide this counter $CN_L$ with an additional $(n/2) + 1)^{th}$ stage as illustrated in FIG. 5, all these stages being connected to respective inputs of a decoder DC which detects a count of $2^{n/2}$ and thereupon energizes a reverse-stepping input of counter $CN_H$ to reduce the count thereof by one, thereby canceling the extra forward step taken by this counter. Since only the first $n/2$ stage outputs of counter $CN_L$ work into the shift register SR as shown in FIG. 2, the transmitted binary work PCM still contains only $n$ bits, the bits assigned to the number of minor quantum steps being all zero in this instance.

Even if the capacitor voltage happens to drop below the level $V_i^*$, owing to unavoidable delays in the response of comparator DS to a polarity reversal in the event of an analog sample slightly less than a whole number of major quantum steps, the arrangement illustrated in FIG. 5 will give a correct reading.

Figure 6:
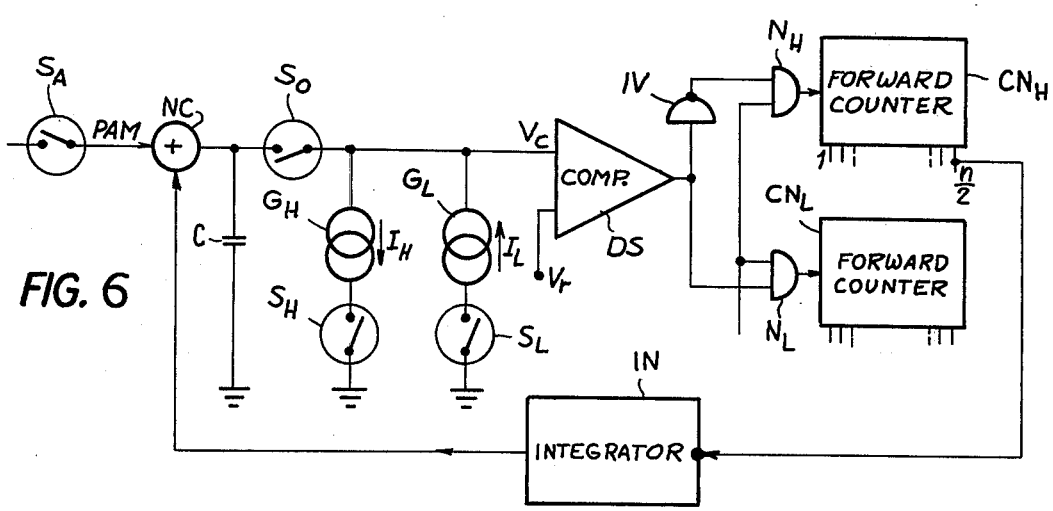

In FIG. 6 we have shown the last (No. $n/2$) stage of counter $CN_H$ connected to an inverting integrator IN whose output is delivered to capacitor C by way of an additive (or subtractive) circuit NC which superimposes that output upon the incoming message sample PAM, assumed to be of the bipolar type. As long as the message signal giving rise to successive samples PAM is properly balanced, this No. $n/2$ counter stage will be energized on the average during half the number of sampling periodsoccurring within a sufficiently long interval measured by the time constant of integrator IN. With proper choice of the output voltage of that counter stage, suitably amplified for this purpose, the output voltage of the integrator will lie at the midpoint of range $V_{max} - V_{min}$ as long as the incoming signal is balanced; the superposition of the integrator output upon that balanced signal then brings the analog sample squarely into this unipolar voltage range. Any relative drift between the mean signal voltage and the reference voltage $V_r$, which determines the lower range limit, will then be automatically compensated inasmuch as a relative rise in the means voltage tends to increase the average number of energizations of the $(n/2)^{th}$ output stage and thus to reduce the output voltage of the inverting amplifier, and vice versa.

As will be readily apparent, this $(n/2)^{th}$ stage emits a sign bit which indicates the polarity of the original bipolar signal.

If the original message signal is unipolar, no major transposition is necessary and the additively or subtractively superposed output voltage of integrator IN merely serves as an error-correcting signal compensating drifts in the magnitude of reference voltage $V_r$, for example.

With the herein disclosed system, in which the highest pulse count per sampling period is $2(n/2) + 1$, the internal bit rate of the converter equals only $128/120 \cdot 10^{-6} \approx 107 \cdot 10^4$ bit/sec. (for $n = 12$) in lieu of the $34 \cdot 10^6$ bit/sec. required in conventional systems.

We claim:

1. In a signaling system including means for periodically sampling an analog voltage ranging between a lower limit $V_{min}$ and an upper limit $V_{max}$, the combination therewith of analog/digital conversion means comprising:

an input capacitor chargeable with an analog-voltage sample at the beginning of a digitization interval $T_x$ forming part of a recurrent sampling cycle;

a first constant-current generator connected across said input capacitor for linearly discharging same at a relatively high rate sufficient to reduce its voltage from said upper limit $V_{max}$ to said lower limit $V_{min}$ in not more than half said digitization interval $T_x$;

a source of forward-counting clock pulses of period $$T = \frac{T_x}{2^{n/2} + 1}$$

timed to coincide with $2^{n/2}$ major quantum steps into which the voltage range $V_{max} - V_{min}$ is divided, each major quantum step being subdivided into $2^{n/2}$ minor quantum steps of uniform height, $n$ being an even integer;

a second constant-current generator connected across said input capacitor for linearly charging same at a relatively low rate corresponding to a minor quantum step per clock pulse;

a supply of reference voltage corresponding to said lower limit $V_{min}$;

discriminating means connected to said input capacitor and to said supply for comparing the capacitor voltage with said reference voltage;

first and second switch means controlled by said discriminating means for respectively actuating said first generator upon said capacitor voltage exceeding said reference voltage and said second generator upon said reference voltage exceeding said capacitor voltage, said first switch means being responsive to said clock pulses for terminating the discharge of said input capacitor by said first generator only after a whole number of pulse periods T upon said capacitor voltage dropping below said reference voltage to cause actuation of said second generator;

first binary counting means connected to be stepped by said forward-counting pulses under the control of said discriminating means during the discharging of said input capacitor by said first generator, thereby producing a first group of $n/2$ bits representing the number of major quantum steps counted;

second binary counting means connected to be stepped by said forward-counting pulses under the control of said discriminating means during the charging of said input capacitor by said second generator until said capacitor voltage substantially equals said reference voltage, thereby producing a second group of $n/2$ bits representing the number of minor quantum steps counted; and circuit means connected to said first and second counting means for combining said first and second groups of bits into a binary word representative of the magnitude of said analog-voltage sample;

said second counting means having a capacity exceeding $2^{n/2}$ and being provided with decoding means for detecting a count of $2^{n/2}$, said first counting means being provided with a reverse-stepping input connected to said decoding means for reducing the count thereof by one upon said second counting means reaching the count of $2^{n/2}$.

2. The combination defined in claim 1 wherein said circuit means is connected to a telecommunication channel for transmitting said binary word to a remote station, said conversion means further comprising:
receiving means at said remote station connected to said channel for separating said first and second groups of bits from each other;
third binary counting means connected to said receiving means for preloading by said first group of bits at the start of a recurrent reconversion cycle;
fourth binary counting means connected to said receiving means for preloading by said second group of bits at the start of a reconversion cycle;
a source of backward-counting clock pulses;
a load circuit including an output capacitor;
a third constant-current generator connected across said output capacitor for linearly charging same at a relatively high rate;
a fourth constant-current generator connected across said output capacitor for linearly discharging same at a relatively low rate, the charging and discharging rates of said third and fourth generators bearing the same ratio as the discharging and charging rates of said first and second generators;
third switch means for applying said backward-counting pulses to said third counting means in an early part of a reconversion cycle for reverse-stepping same with simultaneous actuation of said third generator for charging said output capacitor until said third counting means reaches a zero count; and
fourth switch means operative upon the attainment of a zero count by said third counting means for applying said backward-counting pulses to said fourth counting means with simultaneous actuation of said fourth generator for discharging said output capacitor until said fourth counting means reaches a zero count.

3. The combination defined in claim 2 wherein said backward-counting pulses are of the same cadence as said forward-counting pulses.

4. The combination defined in claim 1 wherein said second counting means has $(n/2)+1$ stages connected to said decoding means, only the first $n/2$ stages thereof being connected to said circuit means.

5. The combination defined in claim 1 wherein said first counting means is provided with $n/2$ stage outputs, the last one of said stage outputs being periodically energized and de-energized at uniform intervals in the presence of an analog-voltage sample at the midpoint of said range, further comprising integrating means connected to said last one of said stage outputs for generating a median potential and mixer means for superposing said median potential upon said analog-voltage sample on said input capacitor.

6. The combination defined in claim 1 wherein said discriminating means comprises a voltage comparator and logical circuitry connected to said comparator for controlling said first and second switch means.

7. The combination defined in claim 6 wherein said logical circuitry comprises a data flip-flop.

* * * * *